(12) United States Patent
Wu

(10) Patent No.: US 12,550,735 B2
(45) Date of Patent: Feb. 10, 2026

(54) SEMICONDUCTOR CHIP HAVING A CRACK-STOP RING STRUCTURE

(71) Applicant: HangZhou HFC semiconductor Corporation, Hangzhou (CN)

(72) Inventor: Zhuojie Wu, Shanghai (CN)

(73) Assignee: HangZhou HFC semiconductor Corporation, Hangzhou (CN)

( * ) Notice: Subject to any disclaimer, the term of this patent is extended or adjusted under 35 U.S.C. 154(b) by 365 days.

(21) Appl. No.: 18/381,163

(22) Filed: Oct. 17, 2023

(65) Prior Publication Data

US 2025/0087602 A1 Mar. 13, 2025

(30) Foreign Application Priority Data

Sep. 8, 2023 (CN) .......................... 202311155935.2

(51) Int. Cl.
*H01L 23/58* (2006.01)
*H01L 23/00* (2006.01)
*H10D 89/00* (2025.01)

(52) U.S. Cl.
CPC .......... *H01L 23/585* (2013.01); *H01L 23/562* (2013.01); *H10D 89/013* (2025.01)

(58) Field of Classification Search
CPC .... H01L 23/562; H01L 23/585; H10D 89/013
See application file for complete search history.

(56) References Cited

U.S. PATENT DOCUMENTS 10,121,755 B1* 11/2018 Bhatkar .................. H01L 24/13
2009/0065952 A1* 3/2009 Su .......................... H01L 23/585
257/E21.705

* cited by examiner

*Primary Examiner* — Zandra V Smith
*Assistant Examiner* — Molly K Reida
(74) *Attorney, Agent, or Firm* — Winston Hsu

(57) ABSTRACT

The invention discloses a semiconductor chip, which includes: a transistor region; and a crack-stop ring structure, which is arranged around the transistor region, wherein the crack-stop ring structure includes a peripheral crack-stop structure surrounding the transistor region along four sides of the semiconductor chip. The corner crack-stop structure is provided only at the corner of the semiconductor chip. The corresponding angles of the corner crack-stop structure and the peripheral crack-stop structure are both right angles. The corner crack-stop structure and the peripheral crack-stop structure are connected to each other in a non-perpendicular manner, thereby forming a closed area at the chip corner.

9 Claims, 10 Drawing Sheets

SEMICONDUCTOR CHIP HAVING A CRACK-STOP RING STRUCTURE

BACKGROUND OF THE INVENTION

1. Field of the Invention

The present invention relates to a semiconductor device, and in particular to a semiconductor chip having a crack-stop ring structure.

2. Description of the Prior Art

As known in the art, after the fabrication of integrated circuits is completed on a wafer, a chip singulation process is performed to cut the wafer along scribe lines. However, wafer dicing can cause damage to integrated circuits, which can originate from crack propagation above and below the silicon substrate surface, leading to severe chip damage or failure.

In order to avoid crack propagation, a double-rail or multi-rail crack-stop ring structure is often used. Dual-rail or multi-rail crack-stop ring structures are usually arranged around the periphery and corners of the transistor region. However, the prior art dual-rail or multi-rail crack-stop ring structure occupies a large chip area. Therefore, a more reliable and cost-effective crack-stop ring structure is needed to reduce or eliminate crack propagation damage to the chip during the wafer dicing process.

SUMMARY OF THE INVENTION

It is one object of the present invention to provide an improved semiconductor chip with a crack-stop ring structure to solve the shortcomings or deficiencies of the prior art.

One aspect of the invention provides a semiconductor chip including a silicon substrate; a transistor region on the silicon substrate; and a crack-stop ring structure located on the silicon substrate and disposed around the transistor region. The crack-stop ring structure comprises a peripheral crack-stop structure and a corner crack-stop structure. The peripheral crack-stop structure surrounds the transistor region along four sides of the semiconductor chip. The corner crack-stop structure is only disposed at a corner of the semiconductor chip. Corresponding angles of the corner crack-stop structure and the peripheral crack-stop structure are right angles, and the corner crack-stop structure and the peripheral crack-stop structure are connected to each other in a non-perpendicular manner, thereby forming a closed area at the corner. A dielectric stack layer is disposed on the silicon substrate, including an intermediate dielectric layer, an inter-metal dielectric layer and an upper insulating layer, wherein the peripheral crack-stop structure and the corner crack-stop structure are composed of metal layers formed in the dielectric stack layer.

According to some embodiments, the closed area is an L-shaped closed area.

According to some embodiments, the peripheral crack-stop structure is located at a first predetermined distance inward from the four sides, and the first predetermined distance is between 10 and 200 micrometers.

According to some embodiments, a second predetermined distance is maintained between the peripheral crack-stop structure and the corner crack-stop structure, and the second predetermined distance is between 0.5 and 5 micrometers.

According to some embodiments, a width of the peripheral crack-stop structure is between 2-20 micrometers, and a width of the corner crack-stop structure is between 2-20 micrometers.

According to some embodiments, the metal layers include metal wires and metal vias, and the peripheral crack-stop structure includes a first side metal wall, and the first side metal wall is composed of continuous metal wires and metal vias.

According to some embodiments, the corner crack-stop structure has second side metal walls at both ends thereof, and the second side metal walls are composed of continuous metal wires and metal vias, and the metal wires or the metal vias between the second side metal walls at both ends of the corner crack-stop structure are discontinuous structures.

According to some embodiments, the discontinuous structure includes isolated metal vias or segments of the metal wires.

According to some embodiments, at least one continuous metal wire in the width direction is included between the second side metal walls at both ends of the corner crack-stop structure.

The double-rail or multi-rail crack-stop ring structure of the present invention is only provided at the corners of the chip. Therefore, it occupies less chip area, is more reliable and cost-effective, and can effectively eliminate the crack propagation and damage of the chip during the wafer dicing process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
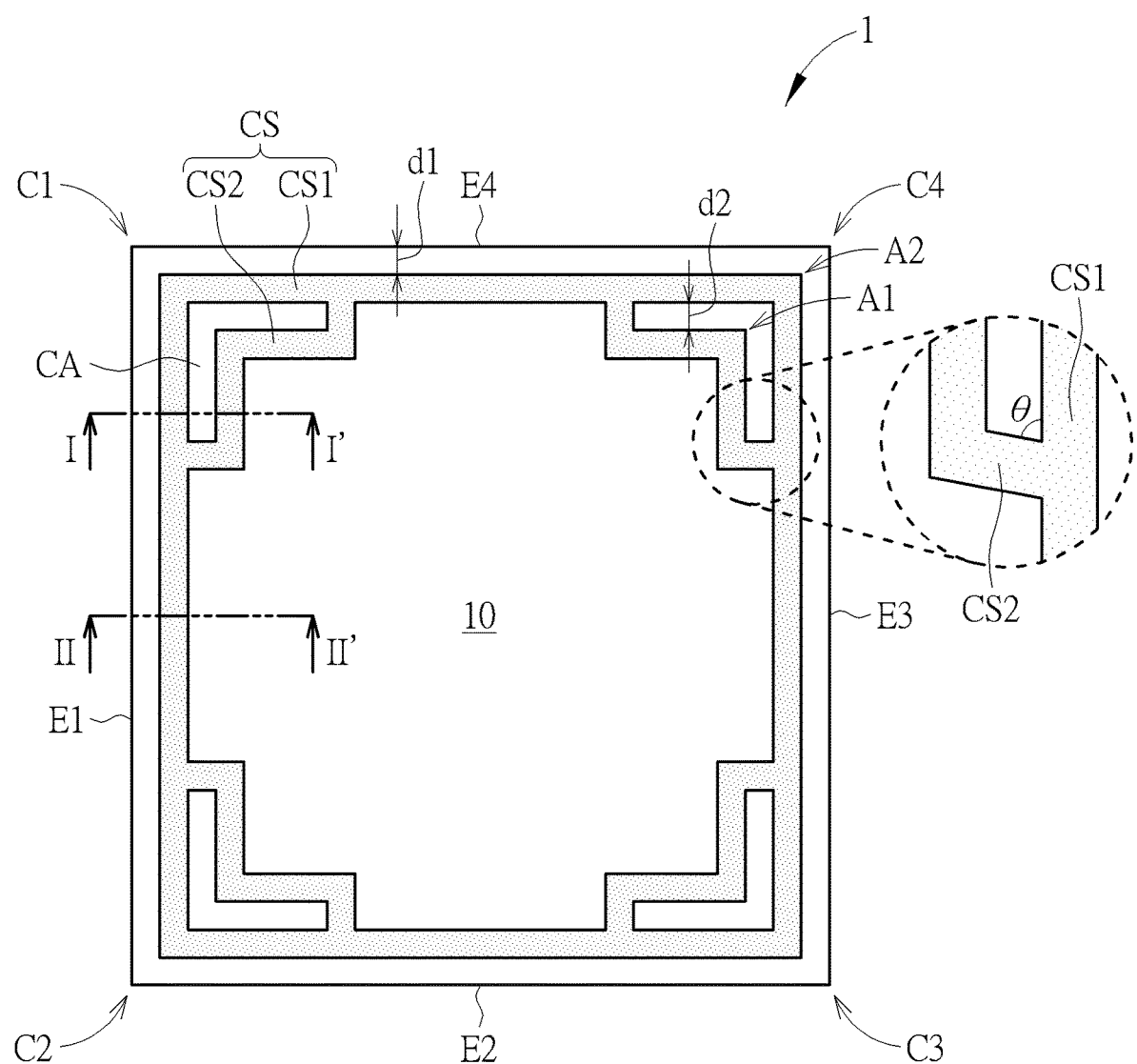
FIG. 1 illustrates a schematic top view of a semiconductor chip according to an embodiment of the present invention.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Figure 2:
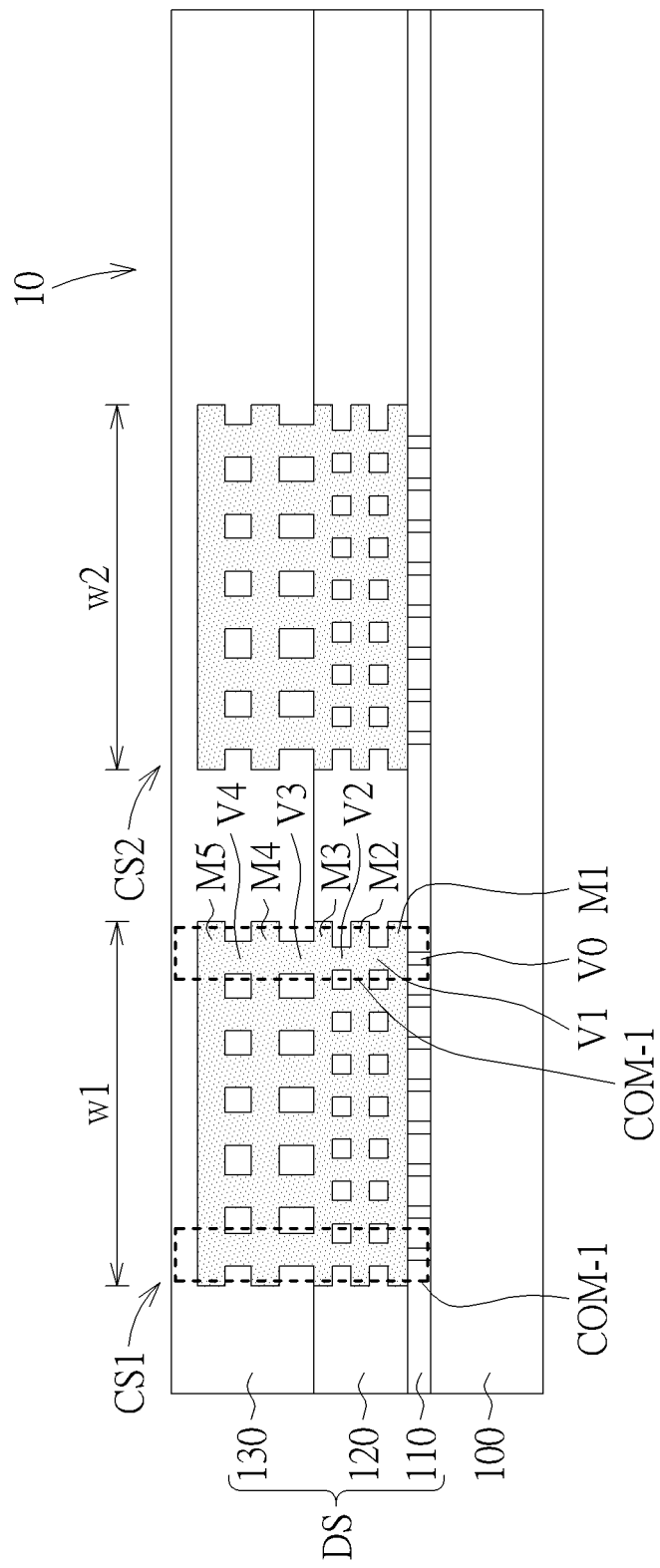
FIG. 2 and FIG. 3 are schematic cross-sectional views taken along lines II' and II-II' in FIG. 1, respectively.
Figure 3:
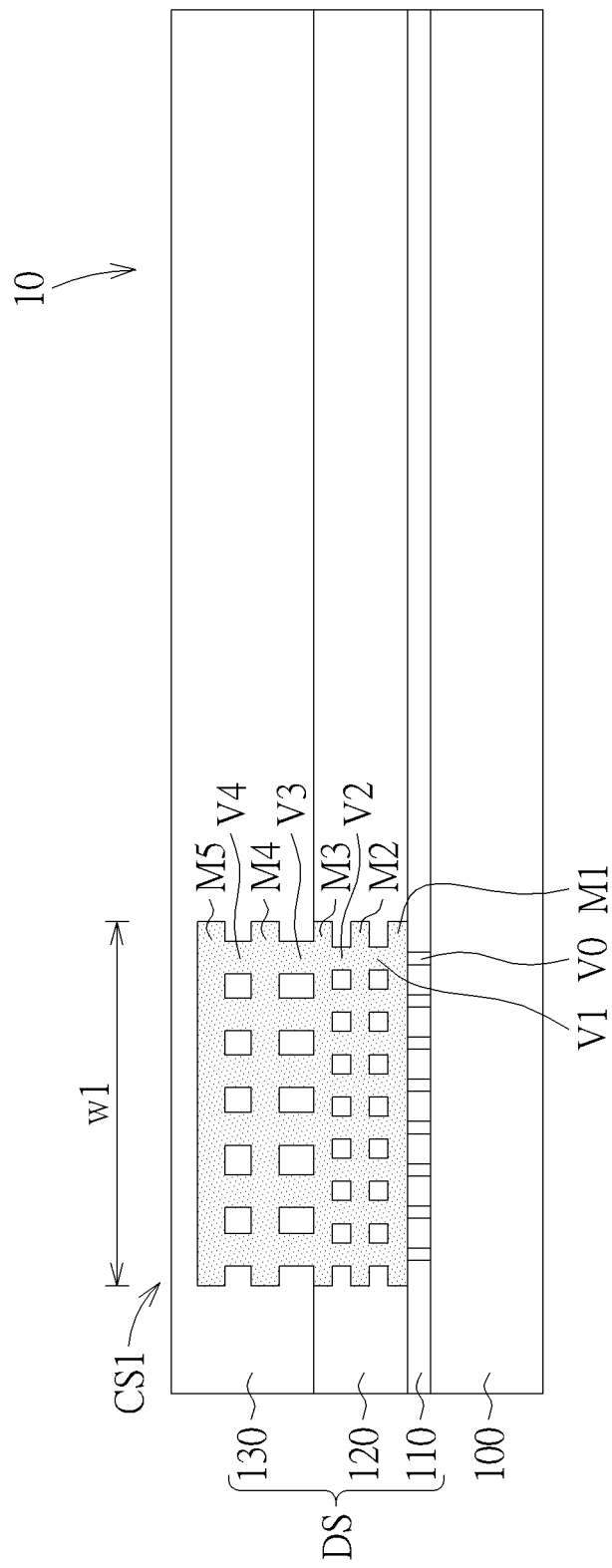

Please refer to FIG. 1 to FIG. 3. FIG. 1 illustrates a top view of a semiconductor chip according to an embodiment of the present invention. FIG. 2 and FIG. 3 are cross-sectional views taken along lines II' and II-II' in FIG. 1, respectively. As shown in FIG. 1, the semiconductor chip 1 has four corners C1-C4 and four sides E1-E4. The side E1 is located between the corners C1 and C2, the side E2 is located between the corners C2 and C3, and the side E3 is located between corners C3 and C4, and the side E4 is between corners C4 and C1. According to an embodiment of the present invention, the side E1 and the side E3 are of the same length, and the side E2 and the side E4 are of the same length, forming a rectangular outline.

According to an embodiment of the present invention, the semiconductor chip 1 is provided with a crack-stop ring structure CS disposed along its perimeter. The crack-stop ring structure CS includes a peripheral crack-stop structure CS1, which continuously surrounds the central transistor region 10 along the four sides E1-E4. According to an embodiment of the present invention, the peripheral crack-stop structure CS1 is disposed at a predetermined distance d1 inward from the four sides E1-E4. For example, the predetermined distance d1 may range from 10 to 200 micrometers, but is not limited thereto.

According to an embodiment of the present invention, the crack-stop ring structure CS further includes four corner crack-stop structures CS2, which are respectively disposed on the inner side of the peripheral crack-stop structure CS1 and adjacent to the four corners C1-C4. The corresponding angles A1 and A2 of the corner crack-stop structures CS2 and the peripheral crack-stop structure CS1 are both right angles, and the corner crack-stop structure CS2 and the peripheral crack-stop structure CS1 are connected to each other in a non-perpendicular manner. For example, as shown in the enlarged area in FIG. 1, the included angle θ at the joint between the corner crack-stop structure CS2 and peripheral crack-stop structure CS1 is less than 90 degrees. In other embodiments, the included angle θ at the joint between the corner crack-stop structure CS2 and the peripheral crack-stop structure CS1 may be greater than 90 degrees. According to an embodiment of the present invention, the four corner crack-stop structures CS2 are not directly connected to each other.

Compared with the four sides E1-E4, the corners C1-C4 are more susceptible to delamination and crack damage. Even if the peripheral crack-stop structure CS1 fails to prevent crack propagation, the corner crack-stop structure CS2 can effectively prevent cracks from spreading at the corners C1-C4. On the adjacent four sides E1-E4, since the risk of crack propagation is relatively low, only a peripheral crack-stop structure CS1 is disposed, which can increase the effective area of the transistor region 10.

According to an embodiment of the present invention, a predetermined distance d2 is maintained between the peripheral crack-stop structure CS1 and the corner crack-stop structure CS2 adjacent to the four corners C1-C4. For example, the predetermined distance d2 may range from 0.5 to 5 micrometers. For example, the predetermined distance d2 may be 2 micrometers, but is not limited thereto. According to an embodiment of the present invention, the shape of the corner crack-stop structure CS2 may be zigzag or arc, but is not limited thereto. According to an embodiment of the present invention, both ends of the corner crack-stop structure CS2 are respectively connected to the peripheral crack-stop structure CS1, thereby forming an L-shaped closed area CA. In this way, a double rail crack-stop structure is only formed at each of the corners C1-C4, and a single rail crack-stop structure is formed on each side.

As shown in FIG. 2 and FIG. 3, the peripheral crack-stop structure CS1 and the corner crack-stop structure CS2 are formed on a silicon substrate 100. According to an embodiment of the present invention, the width w1 of the peripheral crack-stop structure CS1 may range from 2 to 20 micrometers, for example, 8 micrometers. According to an embodiment of the present invention, the width w2 of the corner crack-stop structure CS2 may be between 2-20 micrometers, for example, 8 micrometers. According to an embodiment of the present invention, the width w1 of the peripheral crack-stop structure CS1 and the width w2 of the corner crack-stop structure CS2 may be the same. According to an embodiment of the present invention, the width w1 of the peripheral crack-stop structure CS1 and the width w2 of the corner crack-stop structure CS2 may be different.

According to an embodiment of the present invention, a dielectric stack layer DS is formed on the silicon substrate 100, including but not limited to an intermediate dielectric layer 110, an inter-metal dielectric layer 120 and an upper insulating layer 130. According to embodiments of the present invention, the intermediate dielectric layer 110 may include, but is not limited to, a silicon oxide layer and a silicon nitride layer. According to embodiments of the present invention, the inter-metal dielectric layer 120 may include, but is not limited to, a low dielectric constant material layer or an ultra-low dielectric constant material layer. According to embodiments of the present invention, the upper insulating layer 130 may include, but is not limited to, a tetraethyl orthosilicate (TEOS)-based silicon oxide layer or a passivation material.

According to an embodiment of the present invention, the peripheral crack-stop structure CS1 and the corner crack-stop structure CS2 are composed of metal layers formed in the dielectric stack layer DS on the silicon substrate 100, for example, plugs V0 (e.g., tungsten plugs) formed in the intermediate dielectric layer 110, metal wires M1-M3 and metal vias V1-V2 formed in the inter-metal dielectric layer 120, and metal wires M4-M5 and metal vias V3-V4 formed in the upper insulating layer 130.

According to an embodiment of the present invention, the plugs V0, metal wires M1-M5 and metal vias V1-V4 of the peripheral crack-stop structure CS1 form at least one closed and continuous metal wall that surrounds and protects the transistor region 10. For example, the peripheral crack-stop structure CS1 includes two side metal walls COM-1, which are composed of continuous metal wires M1-M5, plugs V0 and metal vias V1-V4 extending along a direction perpendicular to the paper surface. According to an embodiment of the present invention, the corner crack-stop structure CS2 may be a continuous or discontinuous metal wall structure composed of plugs V0, metal wires M1-M5, and metal vias V1-V4. According to an embodiment of the present invention, the peripheral crack-stop structure CS1 and the corner crack-stop structure CS2 may have the same metal wall structure or different metal wall structures.

Figure 4:
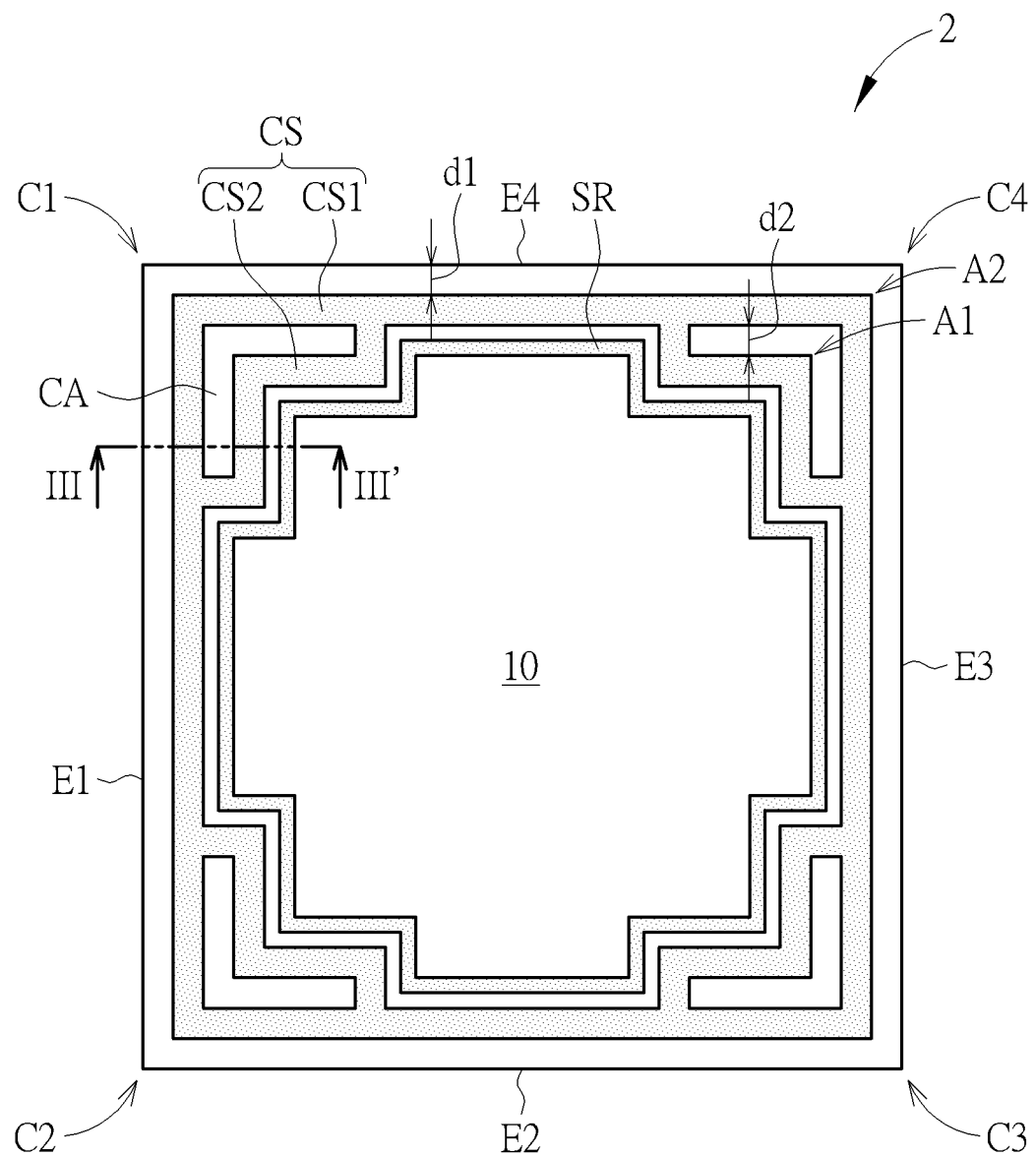
FIG. 4 illustrates a top view of a semiconductor chip according to another embodiment of the present invention.
Figure 5:
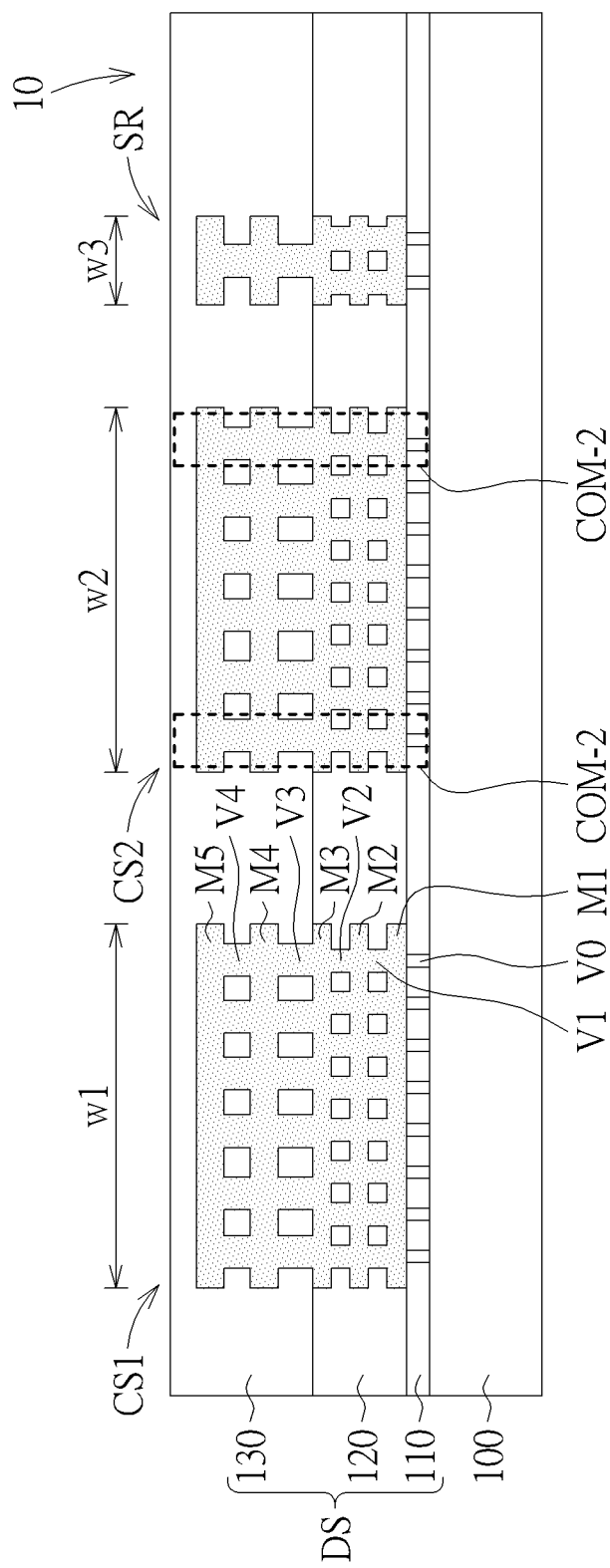
FIG. 5 is a schematic cross-sectional view taken along line III-III' in FIG. 4.

Please refer to FIG. 4 to FIG. 5. FIG. 4 illustrates a top view of a semiconductor chip according to another embodiment of the present invention. FIG. 5 is a cross-sectional view taken along line III-III' in FIG. 4, wherein like area, layer or material is designated by like numeral numbers or labels. As shown in FIG. 4 and FIG. 5, the semiconductor chip 2 also has four corners C1-C4 and four sides E1-E4, where the side E1 is located between the corners C1 and C2, and the side E2 is located between the corners C2 and C3, the side E3 is located between the corners C3 and C4, and the side E4 is located between the corners C4 and C1.

According to an embodiment of the present invention, the semiconductor chip 2 is provided with a crack-stop ring structure CS disposed along its perimeter. The crack-stop ring structure CS includes a peripheral crack-stop structure CS1, which continuously surrounds the central transistor region 10 along the four sides E1-E4. According to an embodiment of the present invention, the peripheral crack-stop structure CS1 is disposed at a predetermined distance d1 inward from the four sides E1-E4. For example, the predetermined distance d1 may range from 10 to 200 micrometers, but is not limited thereto. According to an embodiment of the present invention, the crack-stop ring structure CS further includes four corner crack-stop structures CS2, which are respectively disposed on the inner side of the peripheral crack-stop structure CS1 and adjacent to the four corners C1-C4. The corresponding angles A1 and A2 of the corner crack-stop structures CS2 and the peripheral crack-stop structure CS1 are both right angles, and the corner crack-stop structure CS2 and the peripheral crack-stop structure CS1 are connected to each other in a non-perpendicular manner. According to an embodiment of the present invention, the four corner crack-stop structures CS2 are not directly connected to each other.

According to an embodiment of the present invention, the semiconductor chip 2 further includes a guard ring structure SR located between the transistor region 10 and the crack-stop ring structure CS. As shown in FIG. 5, according to an embodiment of the present invention, the peripheral crack-stop structure CS1, the corner crack-stop structure CS2 and the guard ring structure SR are all composed of metal layers in the dielectric stack layer DS formed on the silicon substrate 100, for example, the plug V0 formed in the intermediate dielectric layer 110, the metal wires M1-M3 and the metal vias V1-V2 formed in the inter-metal dielectric layer 120, and the metal wires M4-M5 and metal vias V3-V4 formed in the upper insulating layer 130. According to an embodiment of the present invention, the width w3 of the guard ring structure SR may be smaller than the width w1 of the peripheral crack-stop structure CS1. According to embodiments of the present invention, the guard ring structure SR may be grounded. According to an embodiment of the present invention, the corner crack-stop structure CS2 has two side metal walls COM-2.

Figure 6:
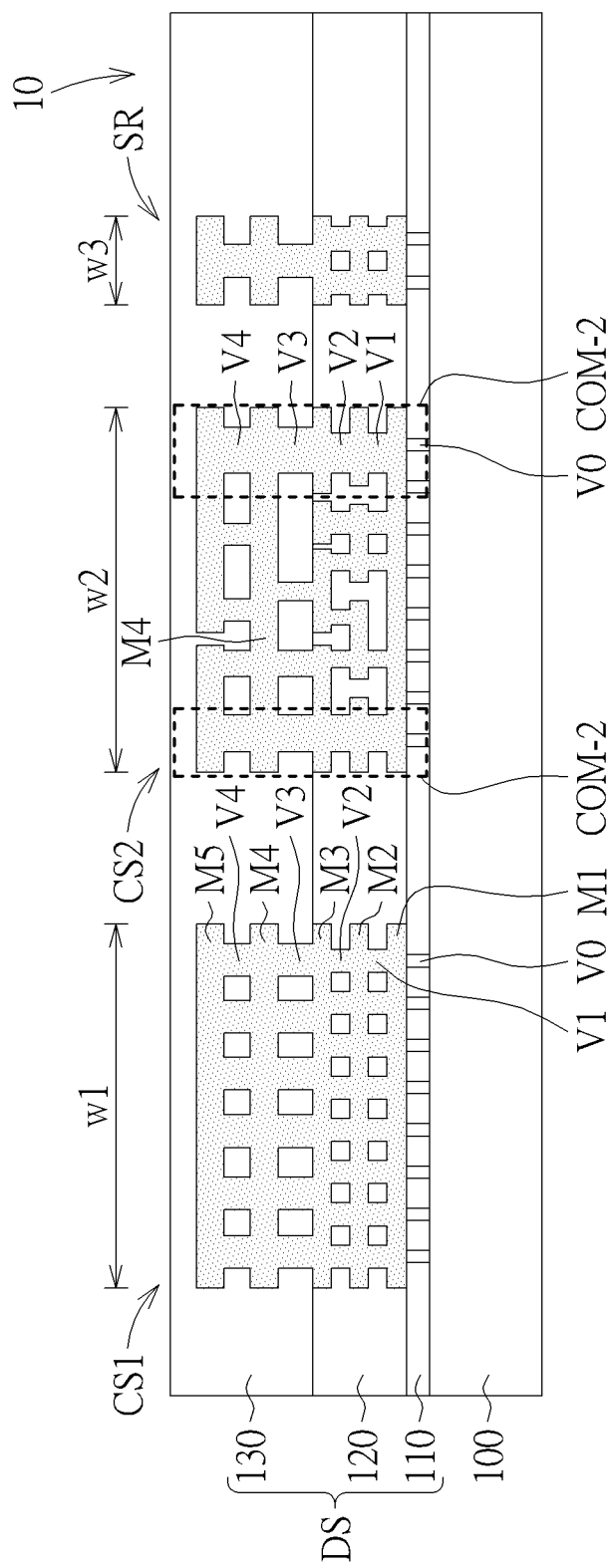
FIG. 6 is a schematic cross-sectional view taken along line III-III' in FIG. 4 according to another embodiment of the present invention.

Please refer to FIG. 6. The corner crack-stop structure CS2 has two side metal walls COM-2, which are composed of continuous metal wires M1-M5, plugs V0 and metal vias V1-V4 extending along a direction perpendicular to the paper surface. One difference between FIG. 6 and FIG. 5 is that the metal wires M1-M5 or metal vias V1-V4 between the two side metal walls COM-2 in FIG. 6 can be discontinuous structures, including, but not limited to, isolated metal vias or segments of metal wire. According to an embodiment of the present invention, the corner crack-stop structure CS2 may include at least one transversely continuous metal wire between the two side metal walls COM-2, for example, the metal wire M4.

Please refer to FIG. 7 to FIG. 10, which are schematic top views of various semiconductor chips according to other embodiments of the present invention, wherein like area, layer or material is designated by like numeral numbers or labels.

Figure 7:
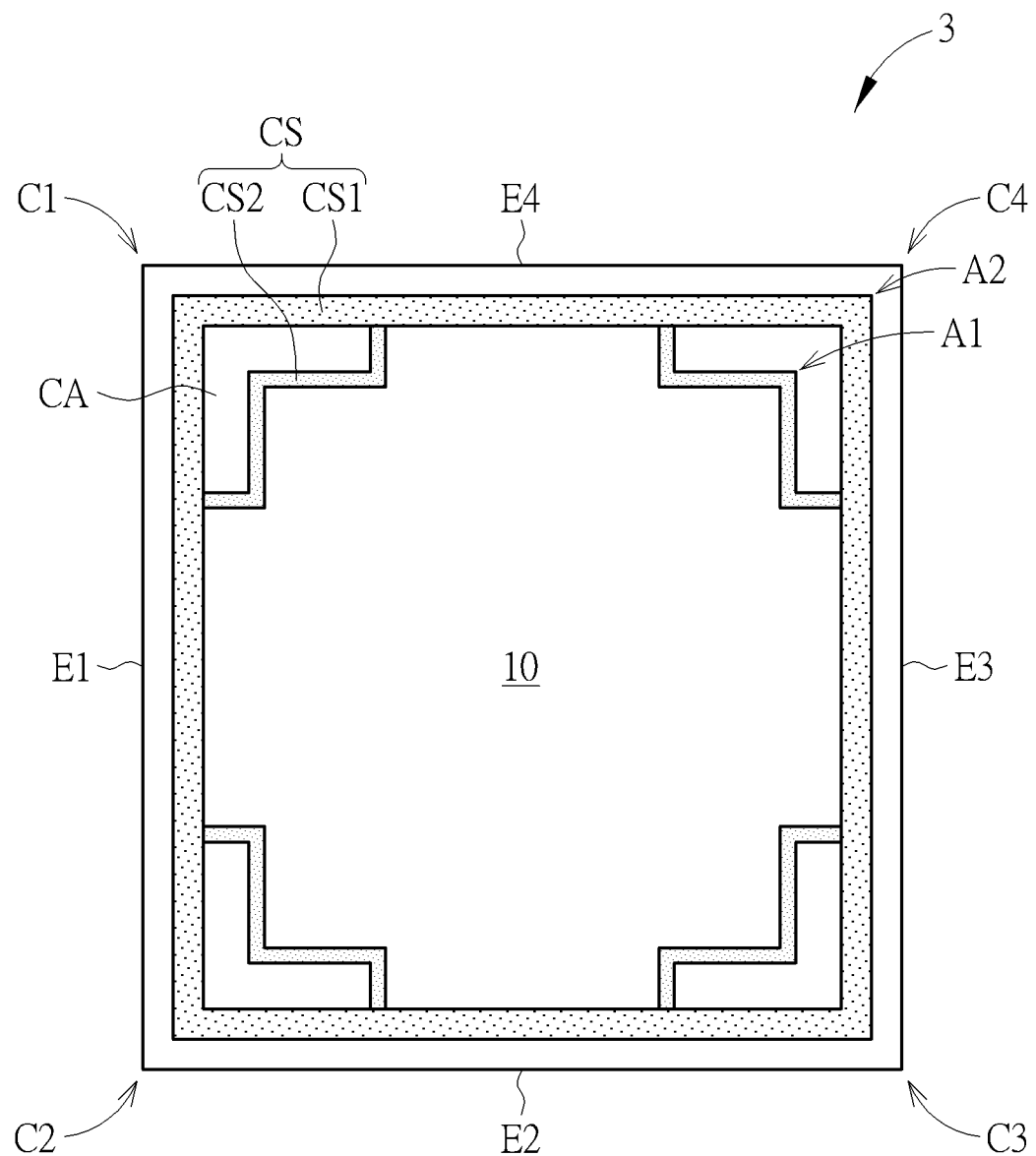
FIG. 7 to FIG. 10 are schematic top views of various semiconductor chips according to other embodiments of the present invention.

As shown in FIG. 7, the semiconductor chip 3 is provided with a crack-stop ring structure CS disposed along its perimeter, including a peripheral crack-stop structure CS1, which continuously surrounds the central transistor region 10 along the four sides E1-E4. According to an embodiment of the present invention, the peripheral crack-stop structure CS1 is disposed at a predetermined distance d1 inward from the four sides E1-E4. For example, the predetermined distance d1 may range from 10 to 200 micrometers, but is not limited thereto. According to an embodiment of the present invention, the crack-stop ring structure CS further includes four corner crack-stop structures CS2, which are respectively disposed on the inner side of the peripheral crack-stop structure CS1 and adjacent to the four corners C1-C4. The corresponding angles A1 and A2 of the corner crack-stop structures CS2 and the peripheral crack-stop structure CS1 are both right angles, and the corner crack-stop structure CS2 and the peripheral crack-stop structure CS1 are connected to each other in a non-perpendicular manner. According to an embodiment of the present invention, the four corner crack-stop structures CS2 are not directly connected to each other.

According to an embodiment of the present invention, a predetermined distance d2 is maintained between the peripheral crack-stop structure CS1 and the corner crack-stop structure CS2. For example, the predetermined distance d2 may be between 0.5 and 5 micrometers. For example, the predetermined distance d2 may be 2 micrometers, but is not limited thereto. According to an embodiment of the present invention, the shape of the corner crack-stop structure CS2 may be zigzag or arc shape, but is not limited thereto. According to an embodiment of the present invention, both ends of the corner crack-stop structure CS2 are respectively connected to the peripheral crack-stop structure CS1, thereby forming a closed area CA. According to an embodiment of the present invention, the width w2 of the corner crack-stop structure CS2 may be smaller than the width w1 of the peripheral crack-stop structure CS1.

Figure 8:
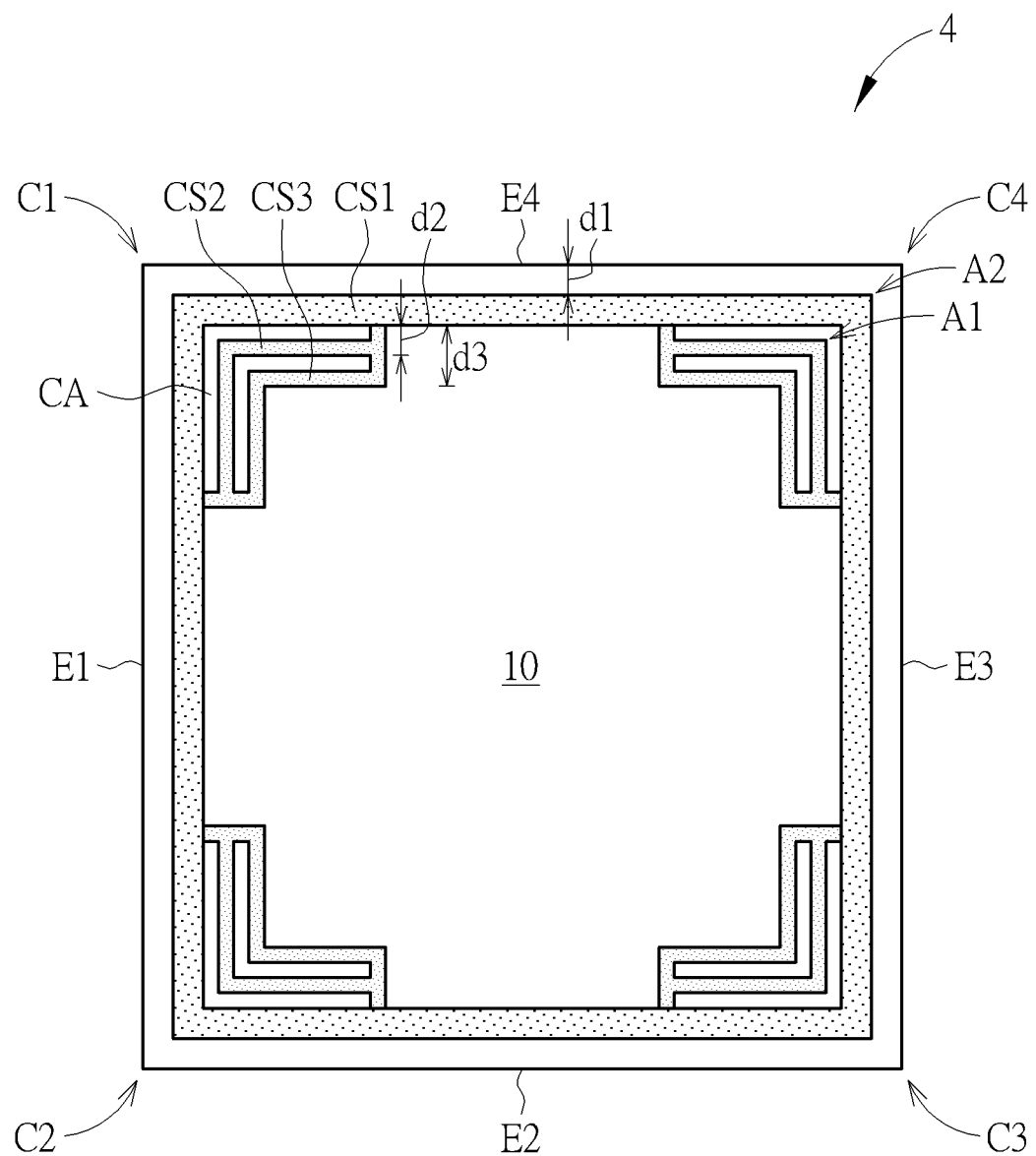

As shown in FIG. 8, the semiconductor chip 4 is provided with a crack-stop ring structure CS disposed along its perimeter, including a peripheral crack-stop structure CS1, which continuously surrounds the central transistor region 10 along the four sides E1-E4. According to an embodiment of the present invention, the crack-stop ring structure CS further includes corner crack-stop structures CS2 and CS3, which are respectively disposed on the inner side of the peripheral crack-stop structure CS1 and adjacent to the four corners C1-C4. The corresponding angles A1 and A2 of the corner crack-stop structures CS2 and CS3 and the peripheral crack-stop structure CS1 are both right angles, and the corner crack-stop structure CS2 and the peripheral crack-stop structure CS1 are connected to each other in a non-perpendicular manner. A predetermined distance d2 is maintained between the corner crack-stop structure CS2 and the peripheral crack-stop structure CS1. For example, the predetermined distance d2 may be between 0.5 and 5 micrometers. For example, the predetermined distance d2 may be 1 micrometer, but is not limited thereto. A predetermined distance d3 is maintained between the corner crack-stop structure CS3 and the peripheral crack-stop structure CS1. For example, the predetermined distance d3 may be between 2 and 8 micrometers. For example, the predetermined distance d3 may be 3 micrometers, but is not limited thereto.

Figure 9:
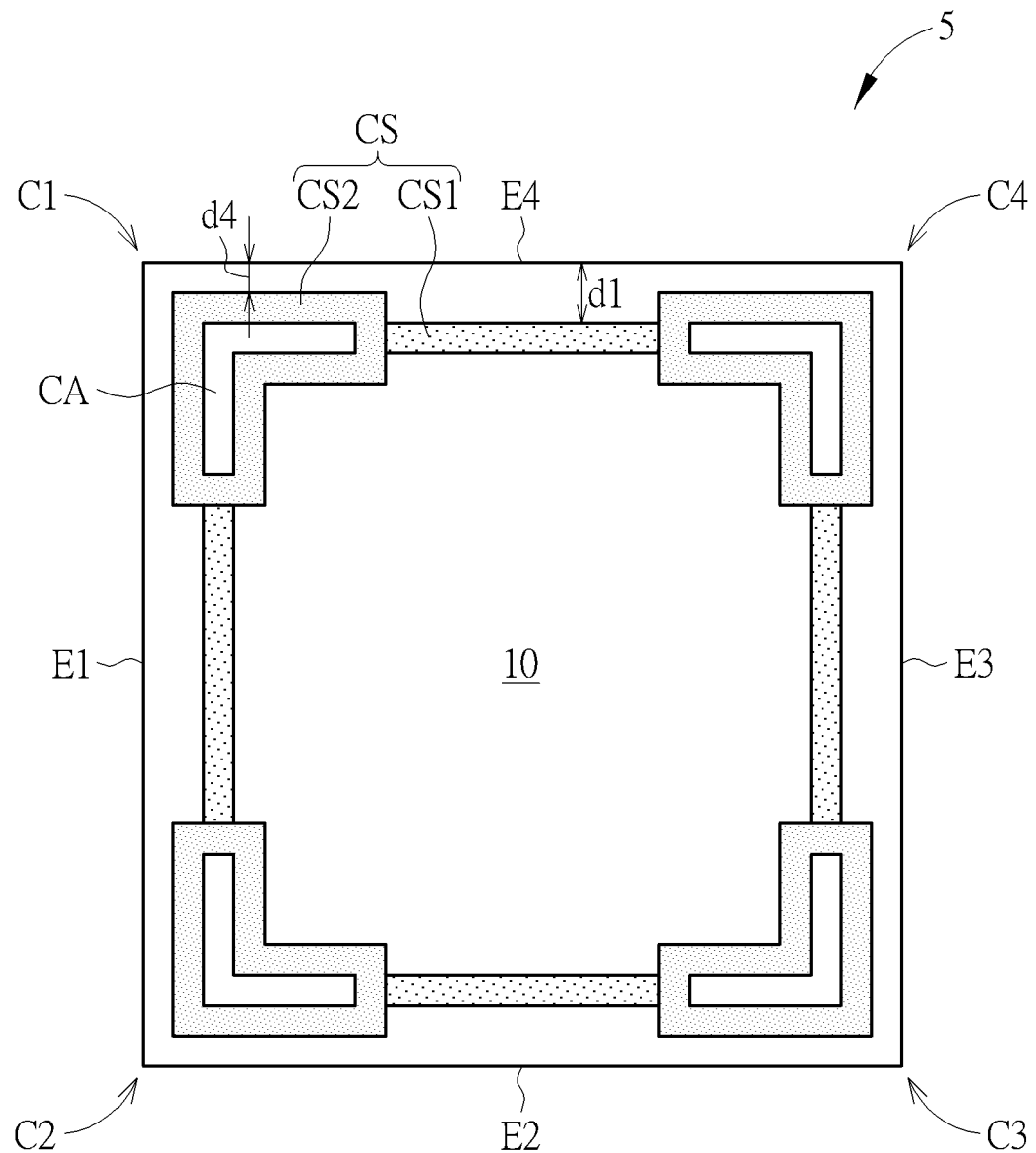

As shown in FIG. 9, the semiconductor chip 5 is provided with a crack-stop ring structure CS disposed along its perimeter, including a peripheral crack-stop structure CS1, which is arranged on four sides E1-E4 and surrounds the central transistor region 10. According to an embodiment of the present invention, the peripheral crack-stop structure CS1 is disposed at a predetermined distance d1 inward from the four sides E1-E4. For example, the predetermined distance d1 may range from 10 to 200 micrometers, but is not limited thereto. According to an embodiment of the present invention, the crack-stop ring structure CS further includes four L-shaped corner crack-stop structures CS2, which are respectively disposed on the inner side of the peripheral crack-stop structure CS1 and adjacent to the four corners C1-C4, wherein the L-shaped corner crack-stop structures CS2 is connected to the peripheral crack-stop structure CS1. According to an embodiment of the present invention, the L-shaped corner crack-stop structure CS2 surrounds a closed area CA. According to an embodiment of the present invention, the L-shaped corner crack-stop structure CS2 is disposed at a predetermined distance d4 inward from the four sides E1-E4. For example, the predetermined distance d4 may range from 10 to 200 micrometers, but is not limited thereto. According to embodiments of the present invention, the predetermined distance d4 may be smaller than the predetermined distance d1.

Figure 10:
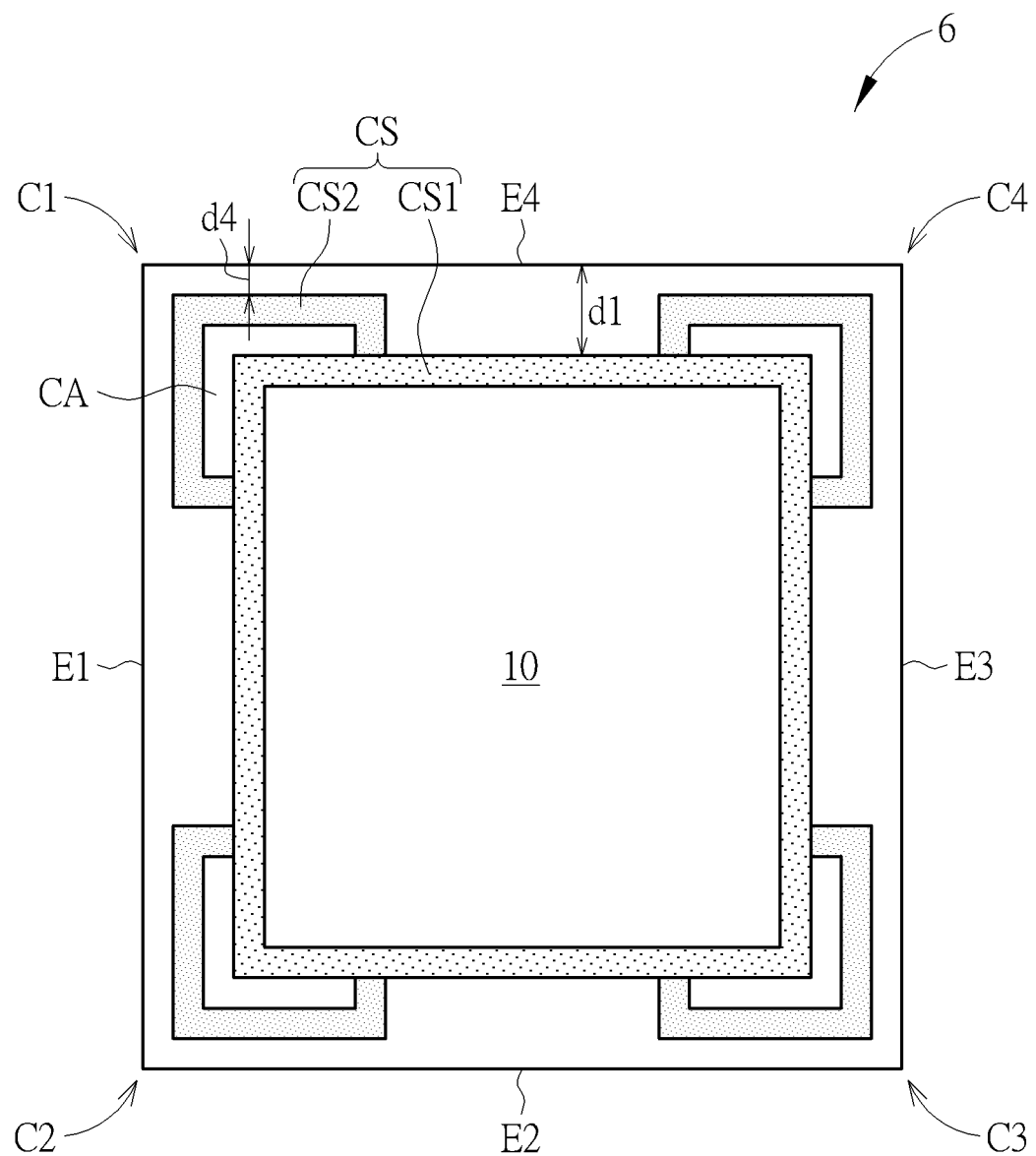

As shown in FIG. 10, the semiconductor chip 6 is provided with a crack-stop ring structure CS disposed along its perimeter, including a peripheral crack-stop structure CS1, which is arranged on four sides E1-E4 and surrounds the central transistor region 10. According to an embodiment of the present invention, the peripheral crack-stop structure CS1 is disposed at a predetermined distance d1 inward from the four sides E1-E4. For example, the predetermined distance d1 may range from 10 to 200 micrometers, but is not limited thereto. According to an embodiment of the present invention, the crack-stop ring structure CS further includes four corner crack-stop structures CS2, which are respectively disposed outside the peripheral crack-stop structure CS1 and adjacent to the four corners C1-C4, wherein the L-shaped corner crack-stop structure CS2 is connected to the peripheral crack-stop structure CS1. According to an embodiment of the present invention, the corner crack-stop structure CS2 and the peripheral crack-stop structure CS1 surround a closed area CA. According to an embodiment of the present invention, the L-shaped corner crack-stop structure CS2 is disposed at a predetermined distance d4 inward from the four sides E1-E4. For example, the predetermined distance d4 may range from 10 to 200 micrometers, but is not limited thereto. According to embodiments of the present invention, the predetermined distance d4 may be smaller than the predetermined distance d1.

The double-rail or multi-rail crack-stop ring structure of the present invention is only provided at the corners of the chip. Therefore, it occupies less chip area, is more reliable and cost-effective, and can effectively eliminate the crack propagation and damage of the chip during the wafer dicing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip, comprising:
a silicon substrate;
a transistor region on the silicon substrate; and
a crack-stop ring structure located on the silicon substrate and disposed around the transistor region, wherein the crack-stop ring structure comprises a peripheral crack-stop structure and a corner crack-stop structure, and the peripheral crack-stop structure surrounds the transistor region along four sides of the semiconductor chip, and the corner crack-stop structure is only disposed at a corner of the semiconductor chip, wherein corresponding angles of the corner crack-stop structure and the peripheral crack-stop structure are right angles, and the corner crack-stop structure and the peripheral crack-stop structure are connected to each other in a non-perpendicular manner, thereby forming a closed area at the corner, wherein a dielectric stack layer is disposed on the silicon substrate, including an intermediate dielectric layer, an inter-metal dielectric layer and an upper insulating layer, wherein the peripheral crack-stop structure and the corner crack-stop structure are composed of metal layers formed in the dielectric stack layer.

2. The semiconductor chip according to claim 1, wherein the closed area is an L-shaped closed area.

3. The semiconductor chip according to claim 1, wherein the peripheral crack-stop structure is located at a first predetermined distance inward from the four sides, and the first predetermined distance is between 10 and 200 micrometers.

4. The semiconductor chip according to claim 1, wherein a second predetermined distance is maintained between the peripheral crack-stop structure and the corner crack-stop structure, and the second predetermined distance is between 0.5 and 5 micrometers.

5. The semiconductor chip according to claim 1, wherein a width of the peripheral crack-stop structure is between 2-20 micrometers, and a width of the corner crack-stop structure is between 2-20 micrometers.

6. The semiconductor chip according to claim 1, wherein the metal layers include metal wires and metal vias, and the peripheral crack-stop structure includes a first side metal wall, and the first side metal wall is composed of continuous metal wires and metal vias.

7. The semiconductor chip according to claim 6, wherein the corner crack-stop structure has second side metal walls at both ends thereof, and the second side metal walls are composed of continuous metal wires and metal vias, and the metal wires or the metal vias between the second side metal walls at both ends of the corner crack-stop structure are discontinuous structures.

8. The semiconductor chip of claim 7, wherein the discontinuous structure includes isolated metal vias or segments of the metal wires.

9. The semiconductor chip according to claim 7, wherein at least one transversely continuous metal wire is included between the second side metal walls at both ends of the corner crack-stop structure.

* * * * *